(12) United States Patent
Paquette

(10) Patent No.: US 8,221,154 B1
(45) Date of Patent: Jul. 17, 2012

(54) ELECTRICAL POWER STRIP FOR USE WITH CLAMP AMMETER

(76) Inventor: John Paquette, Little Rock, AR (US)

( * ) Notice: Subject to any disclaimer, the term of this patent is extended or adjusted under 35 U.S.C. 154(b) by 0 days.

(21) Appl. No.: 13/362,176

(22) Filed: Jan. 31, 2012

(51) Int. Cl.
*H01R 3/00* (2006.01)

(52) U.S. Cl. ......................................... 439/488

(58) Field of Classification Search .................. 439/214, 439/650, 652, 913, 488; 324/127, 117
See application file for complete search history.

(56) References Cited

U.S. PATENT DOCUMENTS

| | | | |
|---|---|---|---|
| 6,095,850 A * | 8/2000 | Liu ................................ | 439/488 |
| 6,295,003 B1 * | 9/2001 | Wu ................................ | 340/664 |
| 6,577,115 B1 * | 6/2003 | Carpenter ..................... | 324/127 |
| 6,993,417 B2 * | 1/2006 | Osann, Jr. ..................... | 700/291 |
| 7,324,006 B2 | 1/2008 | Godard | |
| 7,591,670 B2 * | 9/2009 | Chen et al. .................... | 439/490 |
| 7,677,921 B2 * | 3/2010 | Czarnecki ..................... | 439/517 |
| 7,755,347 B1 | 7/2010 | Cullen et al. | |
| 7,795,759 B2 | 9/2010 | DuBose et al. | |
| 7,982,335 B2 | 7/2011 | Aldag et al. | |
| 8,018,750 B2 | 9/2011 | Unger et al. | |
| 2002/0149502 A1 * | 10/2002 | Goss ........................ | 340/870.07 |
| 2005/0047030 A1 * | 3/2005 | Lee .................................... | 361/1 |
| 2008/0009177 A1 * | 1/2008 | Singer et al. .................. | 439/488 |
| 2011/0141635 A1 | 6/2011 | Fabian | |
| 2011/0215794 A1 | 9/2011 | Gruetter et al. | |

* cited by examiner

*Primary Examiner* — Phuong Dinh
(74) *Attorney, Agent, or Firm* — J. Charles Dougherty

(57) ABSTRACT

A power strip provides simple and quick current flow readings using a standard clamp-type ammeter by means of an aperture passing through the power strip housing. The hot wire and neutral wire passing into the power strip from its cable are passed on opposite sides of the aperture. In this way, the jaws of a clamp-type ammeter may be positioned through the aperture to enclose only a single conductor from the cable, in order to provide an accurate current reading.

14 Claims, 2 Drawing Sheets

ELECTRICAL POWER STRIP FOR USE WITH CLAMP AMMETER

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

An ammeter is a device used for measuring the electrical current present in a circuit. A common type of ammeter is the current clamp ammeter, or as it is sometimes called the current probe ammeter. The current clamp ammeter is a device with two jaws that open and close to allow the jaws to be clamped around an electrical conductor. By closing the jaws, the electrical conductor is thereby circumscribed by the device.

A current clamp ammeter can measure various properties of the electrical current in the conductor. The most common type of current clamp ammeter is the current transformer, which measures current by treating the conductor within the clamp as the primary coil in a transformer, while a wire coil wound around one or both halves of the clamping jaws forms the secondary winding. These devices are particularly suitable for measuring alternating current (AC) passing through a conductor, such as is used in household and many industrial and commercial applications throughout the United States, Canada, and numerous other countries.

While current clamp ammeters are simple to use and relatively inexpensive, they are only useful with respect to standard two-conductor cables if the conductors can be physically separated. This is because the measurement of the clamp ammeter around a multiple-conductor cable will be the vector sum of the currents flowing in the conductors. In the case of a typical two-conductor cable carrying AC current to and from a load, the current flows between the two conductors will cancel out, and the clamp ammeter will display a reading of zero. For this reason, the jaws of the clamp ammeter must be placed around only one of the two conductors in order for an accurate current reading to be achieved.

U.S. Pat. No. 7,755,347 to Cullen et al. teaches a monitor for measuring the current (and other parameters) associated with a power cable. This patent explains the ineffectiveness associated with measurements of current around a two-conductor cable using a typical current transformer, as illustrated in FIG. 1. In order to make such a device functional, the patent teaches that a portion of the insulating cable cover must be cut away so that a single conductor can be withdrawn and placed through the toroidal core of the current transformer, as shown in FIG. 2. The invention described in the patent is directed to a more complex monitor apparatus that employs a plurality of ring-mounted magnetic and/or electric field sensors.

The Cullen et al. '347 patent specifically teaches that an electrician's portable ammeter (i.e., a clamp ammeter) may be used in connection with the arrangement illustrated in FIG. 2, and particularly in connection with the use of a standard power strip. The patent teaches, however, that such an arrangement is undesirable due to two disadvantages. First, one of the conductors must be exposed, which although not expressly stated, would be undesirable as a safety hazard. Second, the device creating the load to which the power cable is connected should be powered down during the addition of the current transformer as a safety precaution, thereby causing undesired system downtime.

The Cullen et al. '347 patent also discusses the use of a "break-out" box for purposes of measuring current flow. A break-out box is a connector inserted between an outlet and a power strip that allows for the measurement of current flow by exposing the individual conductors. Because the conductors are individually exposed, a clamp ammeter may be used to measure current flow by simply placing the jaws of the clamp ammeter around one of the conductors. The patent teaches, however, that such an arrangement is undesirable because either the load equipment must be powered down before the box is inserted—which results in system downtime—or the outer insulation on the conductors must be removed while the equipment is powered, which creates a potential safety risk. The patent also teaches that such an arrangement is undesirable because readings will change as equipment is added or removed from the power strip, thereby necessitating repeated measurements, which are complicated by the need to reinsert the break-out box each time a reading is needed.

A standard power strip (also known in some countries as a "power board") is a series of electrical outlets that are arranged, usually linearly, along a housing that is connected to the end of a flexible cable. The cable is comprised of electrical wiring in an insulated sheath. By connecting each outlet to the wires of the cable, a power strip allows multiple electrical devices to be plugged in, while only one outlet (to which the power strip itself is plugged into by means of the flexible cable) is occupied. These devices are commonly applied to various household uses when a number of electrical devices are in use in close proximity to each other, such that the number of available electrical outlets is smaller than the number of electrical devices requiring power. Common examples include computer equipment and audio/visual equipment. Such power strips typically include a circuit breaker to limit the current that is drawn through them, in order to protect the power strip from overload. The circuit breaker of the power strip also serves to protect the outlet from overload, which could create a fire or electrical shock hazard if the electrical system's circuit breaker or fuse-based overload protection system fails to operate properly.

Although typical power strips do provide overload protection, they generally do not provide the user with any indication concerning the current that is actually passing through the power strip at any given time. The user thus has no direct means of gauging whether adding an additional piece of equipment to an available plug on the power strip, or substituting one piece of equipment for another, is likely to trip the circuit breaker on the power strip. This functionality would also be highly desirable to help prevent overload of the outlet circuit onto which the power strip is attached. Although current meters could be built into power strips, this alternative would make power strips prohibitively expensive for most users, since the user would effectively be purchasing another ammeter for every power strip that the user purchases.

What is desired then is a means of measuring current flow with respect to a power strip that overcomes all of the limitations and concerns associated with the prior art devices, while providing such a means in a simple, inexpensive package. It is further desired that such a device be usable with a standard clamp-type ammeter, such that no special equipment is required in order for a current reading to be taken.

References mentioned in this background section are not admitted to be prior art with respect to the present invention.

BRIEF SUMMARY OF THE INVENTION

The present invention is directed to a power strip with an integrated aperture adapted to receive a clamp ammeter. The wiring of the power strip is so arranged that only one conductor lies on a side of the aperture and between the aperture and a sidewall of the power strip. The aperture is so sized that the jaws of a clamp ammeter may be opened and fitted over the power strip, then released so that they fit through the power strip housing and meet within the aperture. In this way, a single conductor will be within the jaws of the clamp ammeter. An accurate reading of the current flow through the power strip may thus be made. Only a simple clamp ammeter is required, and thus no complex or expensive additional meter technology is required. No metering technology is required to be built into the power strip, thereby reducing complexity and cost of the device. The invention provides a safe and efficient means of measuring current through the power strip at any time, so that repeated readings as equipment changes provide no difficulty, without the necessity of powering down or disconnecting devices for multiple readings, and without compromising safety. The invention further requires only a simple modification to the manufacture of a standard power strip, and thereby provides significant cost advantages to prior art alternatives.

In one aspect, the invention is directed to an electrical power strip comprising a power strip housing, a cable extending through the power strip housing, wherein the cable comprises a hot wire, a neutral wire, and an insulated housing circumscribing the hot wire and neutral wire, an electrical socket accessible from outside of the housing in order to provide power to an electrical device, wherein the electrical socket is connected within the power strip housing to the hot wire and the neutral wire, and an aperture extending through the power strip housing and comprising a first side and a second side, wherein the hot wire is directed through the power strip housing around the first side of the aperture and wherein the neutral wire is directed through the power strip housing around the second side of the aperture.

These and other features, objects and advantages of the present invention will become better understood from a consideration of the following detailed description of the preferred embodiments and appended claims in conjunction with the drawings as described following:

DETAILED DESCRIPTION OF THE PREFERRED EMBODIMENT(S)

Figure 1:
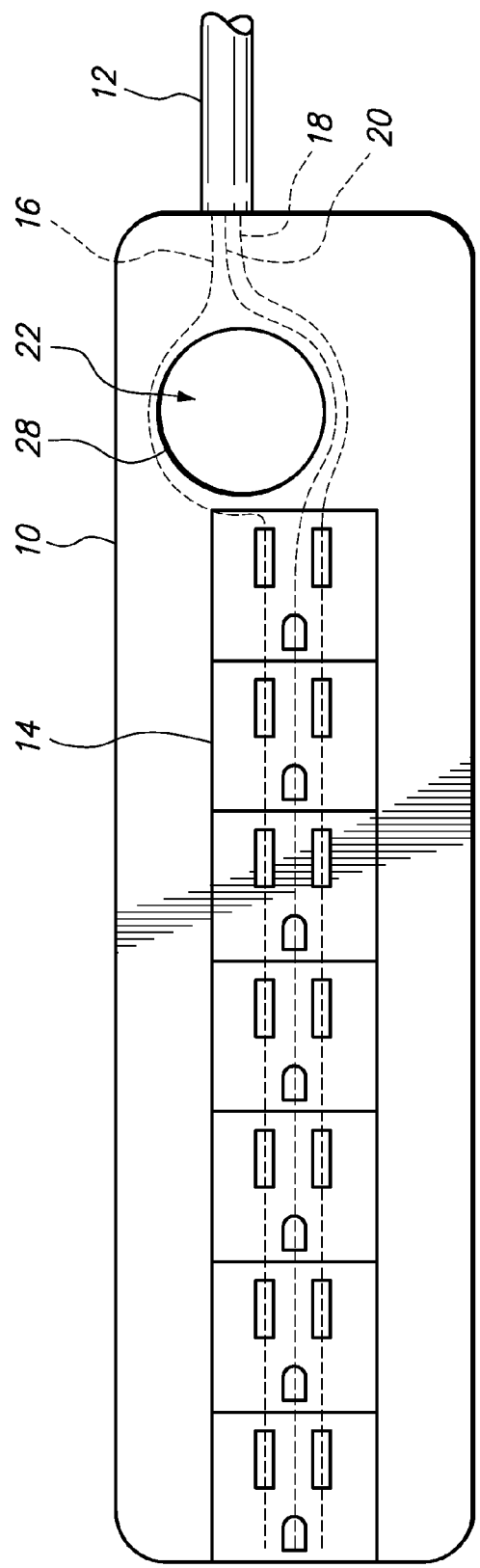
FIG. 1 is a perspective view, in partial cut-away, of a preferred embodiment of the present invention.

With reference to FIG. 1, the preferred embodiment of the present invention may now be described. Power strip housing 10 is connected to cable 12, which passes into power strip housing 10. Cable 12 is of the standard sort used for three-prong grounded electrical plugs in the United States, and is connected to a plug (not shown) opposite the end to which it connects to housing 10. Cable 12 comprises an insulated outer layer, in which hot wire 16, ground wire 18, and neutral wire 20 are bound. Hot wire 16 (typically clad in a black insulative cover) is the wire that carries current to an electrical appliance or other device. Neutral wire 20 (typically clad in a white insulative cover) is the wire that carries current from the electrical appliance or other device, thereby completing the electrical circuit enabling electricity to flow. Ground wire 22 (typically clad in a green insulative cover or being bare wire) connects to the source electrical system ground. When cable 12 enters power strip housing 10, the insulated outer layer is not required, since the wires are therein protected from contact with a user or conductive surfaces or devices by power strip housing 10.

Power strip housing 10 may be constructed of a plastic, metal, or any suitably rigid and durable material. Insulative materials are preferred. Multiple electrical sockets 14 are positioned within housing 10 such that their connection points for matching electrical plugs (not shown) are accessible from the outside of housing 10. Each of multiple electrical sockets 14 are connected to hot wire 16, ground wire 18, and neutral wire 20 in a manner well known in the art. While a standard three-prong grounded version of electrical sockets 14 as commonly used throughout the United States and Canada is shown, other types of electrical sockets 14 are within the scope of invention, many such varying types of electrical sockets 14 being in use around the world. In various embodiments, electrical sockets 14 may eliminate ground wire 18 or connections to ground wire 18 in applications where a ground connection is not available or where the environment in which the device will be used, or applicable laws and regulations, do not require this safety feature.

Aperture 22 is a preferably cylindrical opening that passes through power strip housing 10. In the preferred embodiment, power strip housing 10 is so constructed that the interior of power strip housing 10 is completely sealed off from the outside, including the area within aperture 22. In the preferred embodiment illustrated in FIG. 1, power strip housing 10 is composed of upper housing half 24 and lower housing half 26, which fit or snap together during construction of the device. A cylindrical wall 28 is molded or formed as a part of either or both upper housing half 24 and lower housing half 26, or is a separate part that is fitted between upper housing half 24 and lower housing half 26 during assembly. It may be seen that cylindrical wall 28 serves to seal off the interior of power strip housing 10 from the outside within aperture 22.

During construction of the device, and before fitting upper housing half 24 and lower housing half 26 together during the assembly process, hot wire 16 and neutral wire 20 from cable 12 are fed into power strip housing 10 on opposite sides of cylindrical wall 28. The position of hot wire 16 and neutral wire 20 with respect to cylindrical wall 28 may be swapped in an alternative embodiment, still within the scope of the invention. The purpose is to isolate these two wires from each other for the purpose of current readings, as will be described following. Ground wire 18, when present in a particular embodiment, is preferably fed to the same side of cylindrical wall 28 as neutral wire 20, although the invention is not so limited.

The position of aperture 22 with respect to power strip housing 10 may be varied in various embodiments of the invention. In the embodiment illustrated in FIG. 1, aperture 22 is closer to one side of power strip housing 10. This may be necessary in those embodiments where the width of power strip housing 10 would not otherwise allow access for current readings using a standard clamp-type ammeter. In other embodiments, aperture 22 may be positioned along a longitudinal median line through power strip housing 10, whereby aperture 22 is equally accessible at either side of power strip housing 10. In the preferred embodiment as illustrated, aperture 22 is round and has an inside diameter of at least three-fourths of an inch. This diameter is sufficient to receive most standard-sized clamp ammeters. Other sizes or shapes of aperture 22 may be employed in alternative embodiments, however, to accommodate devices of differing sizes.

Figure 2:
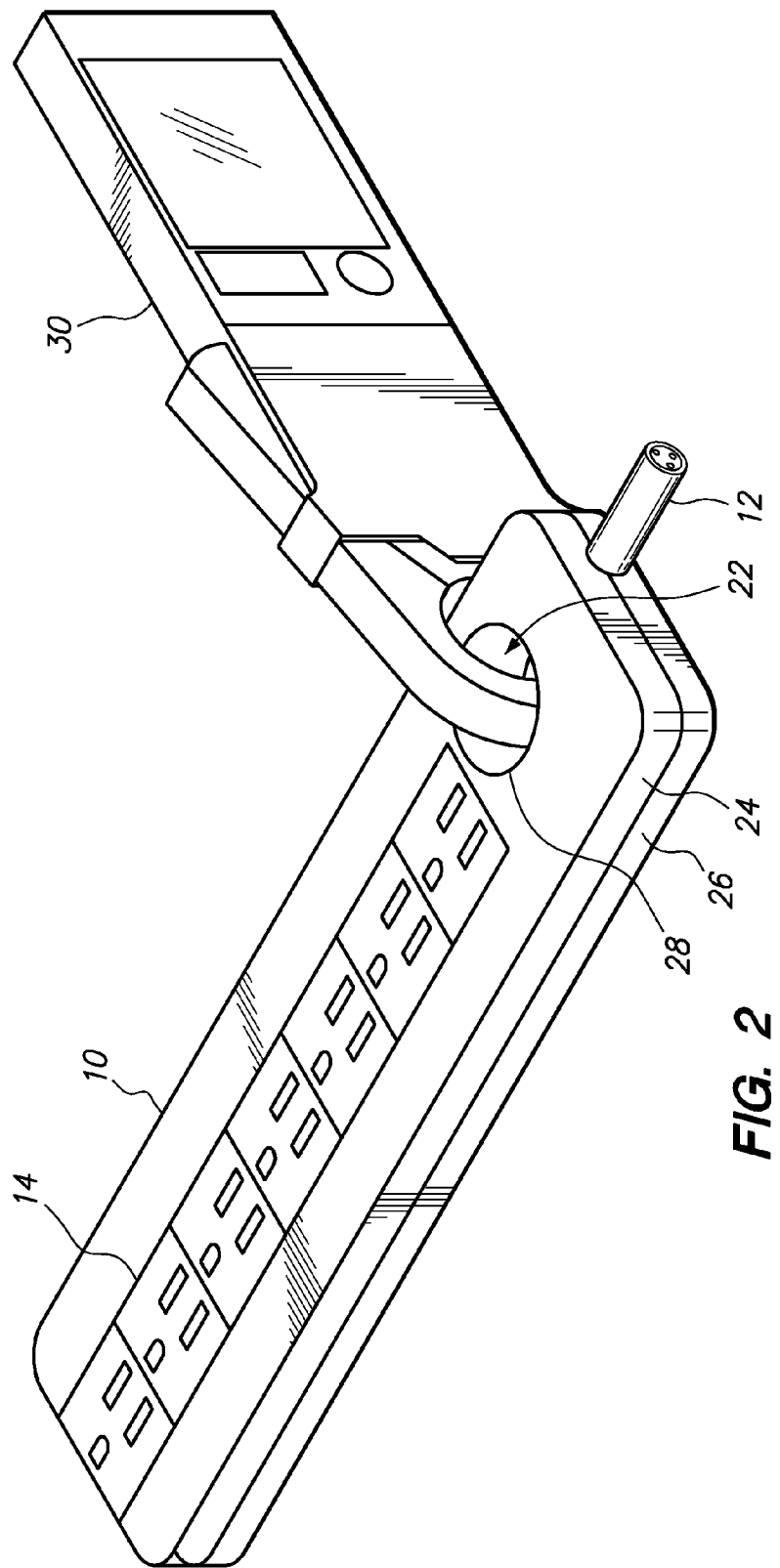
FIG. 2 is a perspective view of a preferred embodiment of the present invention, while in use in connection with a clamp-type ammeter for the purpose of measuring current flow through the device.

Referring now to FIG. 2, use of the preferred embodiment of the present invention in connection with standard clamp-type ammeter 30 may be described. When a load is present at any of sockets 14, and assuming power is available to the powered electrical devices through cable 12, then current will be passing from hot wire 16, through sockets 14, through the powered devices, and back into sockets 14 and out through neutral wire 20. The current may thus be measured by placing the jaws of ammeter 30 around either of hot wire 16 or neutral wire 20. Simply placing the jaws of ammeter 30 around cable 12, however, will not work, since the current from both hot wire 16 and neutral wire 20 will be measured, and since these currents are moving in opposite directions, the vector sum of their currents, as read at ammeter 30, will be zero. Instead, the jaws of ammeter 30 are opened, and closed such that the jaws of ammeter 30 extend through and contact each other through aperture 22. In this way, one of hot wire 16 or neutral wire 20 are isolated within the jaws of ammeter 30, while the other is outside of the jaws of ammeter 30. In the preferred embodiment as illustrated in FIGS. 1 and 2, hot wire 16 will be within the jaws of ammeter 30, although an alternate arrangement encompassing neutral wire 20 within the jaws of ammeter 30 is within the scope of the invention. In this manner, a current flow measurement may be made with respect to the power strip quickly and easily, without the necessity of unplugging the power strip or any of the electrical appliances or devices plugged into the power strip, and without the necessity of stripping any wires in order to provide access to either hot wire 16 or neutral wire 20 alone. Additional current measurements may be made at any time without any changes to the system simply by again placing the jaws of ammeter 30 through aperture 22. This operation may be performed after a new electrical appliance or device is plugged into one of sockets 14, or an electrical appliance or device is unplugged from one of sockets 14. Because each of hot wire 16 and neutral wire 20 remain sealed within housing 10, there is no danger of shock to the user performing current measurements with ammeter 30.

As used herein, "comprising" is synonymous with "including," "containing," or "characterized by," and is inclusive or open-ended and does not exclude additional, unrecited elements or method steps. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims. Thus, additional embodiments are within the scope of the invention and within the following claims.

In general the terms and phrases used herein have their art-recognized meaning, which can be found by reference to standard texts, journal references and contexts known to those skilled in the art. The preceding definitions are provided to clarify their specific use in the context of the invention.

All patents and publications mentioned in the specification are indicative of the levels of skill of those skilled in the art to which the invention pertains. All references cited herein are hereby incorporated by reference to the extent that there is no inconsistency with the disclosure of this specification.

The present invention has been described with reference to certain preferred and alternative embodiments that are intended to be exemplary only and not limiting to the full scope of the present invention as set forth in the appended claims.

The invention claimed is:

1. An electrical power strip, comprising:
   a. a power strip housing;
   b. a cable extending through the power strip housing, wherein the cable comprises a hot wire, a neutral wire, and an insulated housing circumscribing the hot wire and neutral wire along at least a section of the cable;
   c. at least one electrical socket accessible from outside of the housing in order to provide power to an electrical device, wherein the at least one electrical socket is connected within the power strip housing to the hot wire and the neutral wire; and
   d. an aperture extending through the power strip housing and comprising a first side and a second side, wherein the hot wire is directed through the power strip housing around the first side of the aperture and wherein the neutral wire is directed through the power strip housing around the second side of the aperture.

2. The electrical power strip of claim 1, wherein the aperture is cylindrical.

3. The electrical power strip of claim 2, wherein the aperture comprises an inside diameter of at least three-quarters of an inch.

4. The electrical power strip of claim 1, wherein the aperture is sized to receive a pair of jaws from a clamp-type ammeter.

5. The electrical power strip of claim 1, wherein the cable further comprises a ground wire and wherein the at least one electrical socket is connected within the power strip housing to the ground wire.

6. The electrical power strip of claim 5, wherein the ground wire is directed through the power strip housing around the second side of the aperture.

7. The electrical power strip of claim 1, wherein the power strip comprises a first long side and a second long side, and wherein the aperture is positioned through the electrical power strip housing closer to the first long side than to the second long side.

8. The electrical power strip of claim 1, wherein the power strip housing comprises a first housing half and a second housing half.

9. The electrical power strip of claim 1, wherein at least one of the first housing half and second housing half comprise a perimetric wall defining the aperture.

10. The electrical power strip of claim 9, wherein the perimetric wall is a cylindrical wall.

11. The electrical power strip of claim 1, further comprising a cylindrical wall connected to the power strip housing and defining the aperture, wherein the cylindrical wall comprises a first wall side and a second wall side, and wherein the hot wire is wrapped around the first wall side of the cylindrical wall and wherein the neutral wire is wrapped around the second wall side of the cylindrical wall.

12. The electrical power strip of claim 11, wherein the power strip housing comprises a top side and a bottom side, and wherein the cylindrical wall is positioned in the power strip housing closer to the power strip housing top side than to the power strip housing bottom side.

13. The electrical power strip of claim 1, comprising a plurality of electrical sockets accessible from outside of the housing in order to provide power to a plurality of electrical devices, wherein each of the plurality of electrical sockets is connected within the power strip housing to the hot wire and the neutral wire.

14. The electrical power strip of claim 13, wherein the cable further comprises a ground wire and wherein each of the plurality of electrical sockets are connected within the power strip housing to the ground wire.

* * * * *